(12) United States Patent
Heberle

(10) Patent No.: US 9,647,144 B2
(45) Date of Patent: May 9, 2017

(54) INTEGRATED MAGNETIC FIELD SENSOR AND METHOD FOR A MEASUREMENT OF THE POSITION OF A FERROMAGNETIC WORKPIECE WITH AN INTEGRATED MAGNETIC FIELD SENSOR

(71) Applicant: Micronas GmbH, Freiburg (DE)

(72) Inventor: Klaus Heberle, Emmendingen (DE)

(73) Assignee: Micronas GmbH, Freiburg (DE)

( * ) Notice: Subject to any disclaimer, the term of this patent is extended or adjusted under 35 U.S.C. 154(b) by 950 days.

(21) Appl. No.: 13/720,896

(22) Filed: Dec. 19, 2012

(65) Prior Publication Data

US 2013/0154618 A1    Jun. 20, 2013

(30) Foreign Application Priority Data

Dec. 19, 2011   (DE) .................. 10 2011 121 298

(51) Int. Cl.
*H01L 29/82*   (2006.01)
*G01B 7/00*   (2006.01)
*G01D 5/14*   (2006.01)

(52) U.S. Cl.
CPC ............. *H01L 29/82* (2013.01); *G01B 7/00* (2013.01); *G01B 7/003* (2013.01); *G01D 5/147* (2013.01)

(58) Field of Classification Search
CPC .......... G01B 7/00; G01B 7/003; G01D 5/147; H01L 29/82
See application file for complete search history.

(56) References Cited

U.S. PATENT DOCUMENTS

| 5,105,151 A * | 4/1992 | Takahashi ............. G01N 27/82 324/225 |
| 5,963,028 A | 10/1999 | Engel et al. |
| 7,250,760 B2 | 7/2007 | Ao |
| 2004/0174164 A1* | 9/2004 | Ao ...................... G01D 5/145 324/252 |
| 2006/0261801 A1 | 11/2006 | Busch |
| 2008/0308886 A1* | 12/2008 | Ausserlechner et al. ............. B81C 1/00333 257/421 |

(Continued)

FOREIGN PATENT DOCUMENTS

DE    698 27 559 T2    12/2005
EP    1 436 849 B1    12/2006

(Continued)

*Primary Examiner* — Patrick Assouad
*Assistant Examiner* — Haidong Zhang
(74) *Attorney, Agent, or Firm* — Muncy, Geissler, Olds & Lowe, P.C.

(57) ABSTRACT

An integrated magnetic field sensor, having a semiconductor body with a surface and a rear surface, and a metal carrier, with a front and a rear, wherein the rear of the semiconductor body is connected to the front of the metal carrier in a non-positive manner, and a Hall sensor, embodied on the surface of the semiconductor body, with a main extension surface, and a magnet with a first magnetic pole embodied along a first surface, which first magnetic pole has a central axis embodied in a perpendicular manner on the first surface, wherein the metal carrier, the magnet and the semiconductor body are arranged in a common housing and precisely one or at least one Hall sensor is arranged in the housing.

16 Claims, 1 Drawing Sheet

(56) References Cited

U.S. PATENT DOCUMENTS

| | | | |
|---|---|---|---|
| 2009/0140725 A1* | 6/2009 | Ausserlechner | G01R 33/072 |
| | | | 324/207.2 |
| 2010/0219810 A1 | 9/2010 | Rocznik et al. | |
| 2011/0291650 A1 | 12/2011 | Franke et al. | |
| 2012/0007589 A1* | 1/2012 | Okada | G01D 5/145 |
| | | | 324/207.2 |

FOREIGN PATENT DOCUMENTS

| FR | 2 852 098 A1 | 9/2004 |
|---|---|---|
| WO | WO 2010/060607 A2 | 6/2010 |

\* cited by examiner

INTEGRATED MAGNETIC FIELD SENSOR AND METHOD FOR A MEASUREMENT OF THE POSITION OF A FERROMAGNETIC WORKPIECE WITH AN INTEGRATED MAGNETIC FIELD SENSOR

This nonprovisional application claims priority under 35 U.S.C. §119(a) to German Patent Application No. DE 10 2011 121 298.5, which was filed in Germany on Dec. 19, 2011, and which is herein incorporated by reference.

BACKGROUND OF THE INVENTION

Field of the Invention

The invention relates to an integrated magnetic field sensor and a method for determining a position of a ferromagnetic workpiece with an integrated magnetic field sensor.

Description of the Background Art

From WO 2010/060607 A2 (which corresponds to US 20110291650, and which is incorporated herein by reference), an IC housing with a semiconductor chip with an integrated circuit and an integrated magnetic sensor is known. A permanent magnet, the magnetic flux of which penetrates the sensor, is spaced apart from the housing of the semiconductor chip. When an object to be measured approaches the head-side end of the semiconductor chip, the magnetic flux density through the sensor changes.

From EP 1 436 849 and US 20100219810 an arrangement with a magnetic field sensor is known.

From DE 10 2004 010 126 A1, which corresponds to U.S. Pat. No. 7,250,760, integrated magnetic Hall sensors are known in which a permanent magnet is also arranged in the IC housing. The Hall sensors are hereby arranged with respect to the field of the permanent magnet such that a Hall voltage is produced without external field influence.

From DE 698 27 559 T2, which corresponds to U.S. Pat. No. 6,265,865, an integrated Hall effect sensor is known in which a Hall sensor is arranged above and a permanent magnet is arranged below a metallic carrier, which is also referred to as a leadframe. The individual components are arranged in a single IC housing. The permanent magnet is arranged inside the IC housing such that the resulting magnetic field is perpendicular to the integrated Hall sensor. In other words, the magnetic field lines run essentially perpendicular to a main extension plane of the Hall sensor and generate a Hall voltage without external field influence. With an arrangement of a ferromagnetic component embodied outside the IC housing, directly above the main extension direction of the Hall sensor, the reluctance is reduced compared to without a ferromagnetic component and the Hall voltage is increased.

SUMMARY OF THE INVENTION

It is therefore an object of the invention to provide a device that further develops the prior art. The object is attained in an embodiment by an integrated magnetic field sensor and by a method for determining the position of a ferromagnetic workpiece with an integrated magnetic field sensor.

According to an embodiment of the invention, an integrated magnetic field sensor is disclosed, wherein the integrated magnetic field sensor has a semiconductor body with a surface and a rear surface, and a metal carrier, with a front and a rear, wherein the rear surface of the semiconductor body is connected to the front of the metal carrier in a non-positive manner, and the integrated magnetic field sensor has a Hall sensor, wherein the integrated magnetic field sensor is embodied on the surface of the semiconductor body, and the Hall sensor has a main extension surface and a magnet with a first magnetic pole embodied along a first surface and the magnet has a central axis embodied in a perpendicular manner on the first surface, wherein the metal carrier, the magnet and the semiconductor body are arranged in a common housing, and precisely one or at least one Hall sensor is arranged in the housing, and wherein the first surface of the magnet is embodied perpendicular to the main extension surface of the Hall sensor and the central axis runs parallel to the main extension plane of the Hall sensor and the central axis passes in a perpendicular manner through the normal of the main extension surface, wherein the normal stands in the centroid of the main extension surface and the field lines of the magnet run essentially parallel to the main extension surface of the Hall sensor so that a Hall voltage is generated when a part of the magnetic field lines are deflected by means of a ferromagnetic component perpendicular to the main extension plane of the Hall sensor, and whereby the magnet is formed on a front side of the metal carrier. It should be noted that due to the geometric alignment of the Hall sensor to the magnet, also referred to below as a permanent magnet, without external influence by means of a ferromagnetic component only a very low Hall voltage or no Hall voltage is applied at the Hall sensor. Naturally, the magnet is to be arranged in the immediate vicinity of the Hall sensor preferably at a distance of less than 10 mm, preferably less than 2 mm, and very preferably less than 0.7 mm. The distance is understood to be a range from the surface of the magnet to the centroid of the main extension surface.

According to an embodiment of the invention, a method for determining the position of a ferromagnetic component with an integrated magnetic field sensor is disclosed, having a semiconductor body with a surface and a rear surface and a metal carrier with a front and a rear, wherein the rear surface of the semiconductor body is connected to the front of the metal carrier in a non-positive manner, and a Hall sensor, embodied on the surface of the semiconductor body, with a main extension surface and a magnet, with a first magnetic pole embodied along a first surface, which first magnetic pole has a central axis embodied in a perpendicular manner on the first surface, wherein the metal carrier, the magnet and the semiconductor body are arranged in a common housing and precisely one or at least one Hall sensor is arranged in the housing, and wherein the first surface of the magnet is embodied perpendicular to the main extension surface of the Hall sensor and the central axis runs parallel to the main extension plane of the Hall sensor and the central axis passes in a perpendicular manner through the normal of the main extension surface, wherein the normal stands in the centroid of the main extension surface and the field lines of the magnet run essentially parallel to the main extension surface of the Hall sensor, so that a Hall voltage is generated when a part of the magnetic field lines are deflected by means of a ferromagnetic component perpendicular to the main extension plane of the Hall sensor and whereby the magnet is formed on a front side of the metal carrier.

An advantage of the device and the method according to the invention is that through the combination of a semiconductor body, also referred to as a die, with a permanent magnet on a common metal carrier, also referred to as a leadframe, and the course parallel to the main extension plane of the magnetic field lines, the sensitivity of the integrated magnetic field sensor with respect to the detection of a change of the magnetic flux density is changed. One reason for this is that by means of the very small distance between the Hall sensor and the permanent magnet and the spatial advantageous alignment of the main extension surface of the Hall sensor and the permanent magnet, a Hall voltage is generated preferably not until and very preferably only when a ferromagnetic component arranged in the vicinity outside the housing changes the flux density in the Hall sensor.

According to an embodiment, the Hall voltage is increased with the deflection of the magnetic field lines. Tests have shown that even a slight approach of a ferromagnetic component leads to a generation of a Hall voltage. The location of the ferromagnetic component can be determined from the sign and the strength. In order to increase the precision of the determination, it is advantageous before a determination to carry out a calibration with the component to be determined and to determine the Hall voltages depending on the location or on the position of the ferromagnetic component and to store them in a characteristic curve family.

In another embodiment the Hall sensor has a lateral surface embodied orthogonally to the main extension plane, wherein the central axis of the permanent magnet is arranged on the lateral surface in a perpendicular manner. It is advantageous if the permanent magnet is embodied on the front of the metal carrier. A particularly small distance, preferably less than 1 mm, can be achieved hereby between the permanent magnet and the Hall sensor, i.e., the magnetic flux density through the Hall sensor is particularly high. The sensitivity of the device or of the method can be increased hereby in that even a small influence, i.e. deviation from the parallelism leads to a perceptible Hall voltage.

According to another further embodiment, the Hall sensor can be embodied as a 1-dimensional or 2-dimensional or 3-dimensional Hall sensor. Preferably, the Hall sensors are aligned orthogonally to one another in the individual dimensions. Further, according to a first alternative with a 2-dimensional embodiment both main extension surfaces are aligned to the course of the magnetic field lines such that a Hall voltage is generated essentially only when the magnetic field lines are deflected by means of the ferromagnetic component. In a second alternative embodiment with the 2-dimensional or with the 3-dimensional Hall sensor one of the main extension surfaces of the Hall sensor is aligned to pole of the magnet such that a Hall voltage is generated in the one of the Hall sensors. In other words, the Hall sensor is arranged in a second dimension to the first pole of the magnet such that a Hall voltage is generated even without the ferromagnetic component. The field strength of the permanent magnet can be determined hereby and the detection precision of the sensor arrangement increased.

In an embodiment, the Hall sensor is embodied as a Hall plate. Preferably, with a 2-dimensional or with a 3-dimensional embodiment, the Hall sensor has 2 or 3 Hall plates embodied orthogonally to one another.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
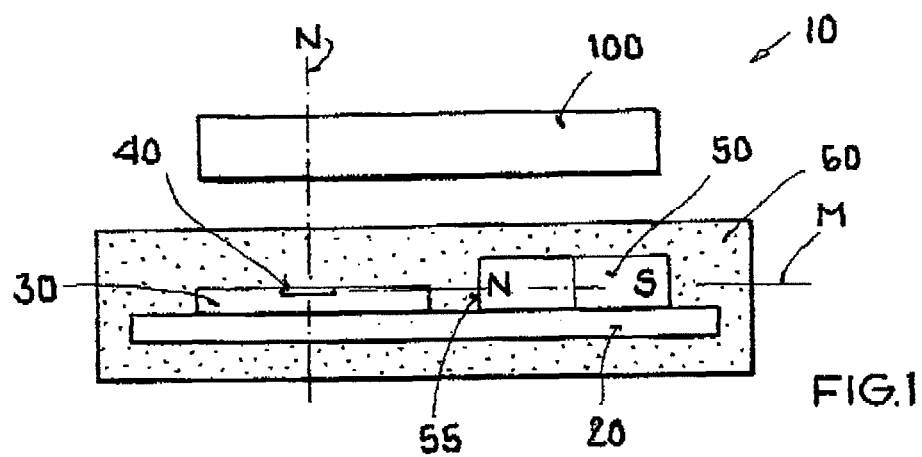
FIG. 1 a cross section of a first embodiment according to the invention of an integrated magnetic field sensor, FIG. 2 a cross section of a second embodiment according to the invention of an integrated magnetic field sensor, FIG. 3 a cross section of a third embodiment according to the invention of an integrated magnetic field sensor.

The image of FIG. 1 shows a first embodiment according to the invention of an integrated magnetic field sensor 10, having a metal carrier 20, with a front and a back and a semiconductor body 30 arranged on the front of the metal carrier 20, with a surface and a rear surface. The semiconductor body 30 is connected by the rear surface in a non-positive manner to the front of the metal carrier. On the surface the semiconductor body 30 has a Hall sensor 40. The Hall sensor 40, which is preferably embodied as a Hall plate, has a main extension surface running parallel to the surface of the semiconductor body 30. Furthermore, a magnet 50 is arranged on the front of the metal carrier 20. The magnet 50 has a first magnetic north pole embodied along a first surface 55 and a central axis M embodied in a perpendicular manner on the first surface 55. The first surface 55 of the magnet 50 is embodied perpendicular to the main extension surface of the Hall sensor 40. Furthermore, the central axis M runs parallel to the main extension plane of the Hall sensor 40. Preferably, the central axis M meets the normal N of the main extension surface in a perpendicular manner in the centroid of the main extension surface so that the field lines of the magnet 50 run essentially parallel to the main extension surface of the Hall sensor 40. Naturally, the normal N is arranged essentially, preferably precisely in the centroid of the main extension surface. The metal carrier 20, the magnet 50 and the semiconductor body 30 are arranged in a common single housing 60. Precisely one or at least one Hall sensor is arranged in the housing 60. A ferromagnetic component 100 is provided outside the housing 60 above the surface of the semiconductor body 30.

In the present case the magnetic field lines are deflected perpendicular to the main extension plane of the Hall sensor by means of the ferromagnetic component 100 and a Hall voltage is hereby generated. It should be noted that the sign of the Hall voltage depends on the position of the ferromagnetic component 100 to the main extension plane of the Hall sensor 40 and of the magnet 50. In other words, the Hall voltage increases in terms of amount with an approach of the component to the housing.

Figure 2:
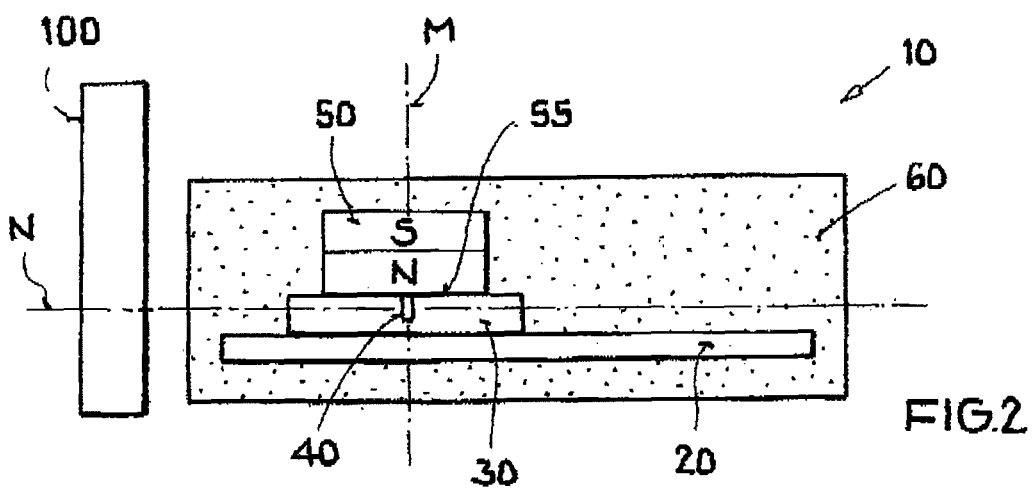

The image of FIG. 2 shows a cross section of a second embodiment according to the invention of an integrated magnetic field sensor 10. Only the differences from the embodiment of FIG. 1 are explained below. The first surface 55 of the magnet 50 is arranged preferably adjusted centrally on the surface of the semiconductor body 30. The central axis M of the magnet 50 hereby meets the normal N of the main extension surface of the Hall sensor 40 in an essentially perpendicular manner. The normal N is arranged essentially, preferably precisely in the centroid of the main extension surface of the Hall sensor 40. The ferromagnetic component 100 is arranged on a front face of the housing 60. The magnetic field lines are hereby deflected such that a Hall voltage is generated.

Figure 3:
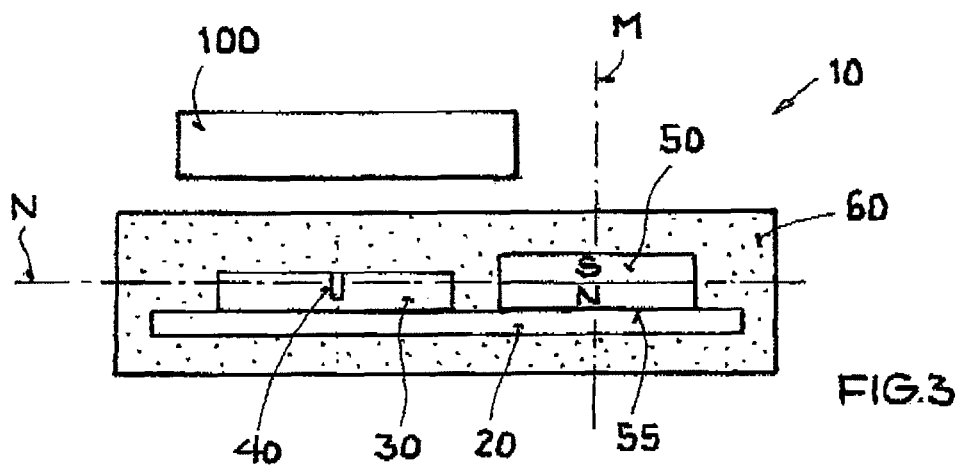

The image of FIG. 3 shows a cross section of a third embodiment according to the invention of an integrated magnetic field sensor 10. Only the differences from the above embodiments are explained below. The first surface 55 of the magnet 50 is arranged in a non-positive manner on the front of the metal carrier 20. It is preferred to arrange the normal N at the level of the connection layer between the two poles of the magnet. The central axis M of the magnet 50 hereby meets the normal N of the main extension surface of the Hall sensor 40 in an essentially perpendicular manner. The normal N is arranged essentially, preferably precisely in the centroid of the main extension surface of the Hall sensor 40. The ferromagnetic component 100 is arranged outside the housing 60 above the surface of the semiconductor body 30. The magnetic field lines are hereby deflected such that a Hall voltage is generated. It should be noted that the Hall sensor 40 is embodied as a multi-dimensional Hall sensor (40), wherein the individual dimensions of the Hall sensor (40) are aligned orthogonally to one another.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated magnetic field sensor comprising:
    a semiconductor body with a first surface and a second surface, the first surface being parallel to the second surface;
    a metal carrier with a lower surface and an upper surface, the first surface of the semiconductor body being disposed on the upper surface of the metal carrier;
    a Hall sensor arranged on the second surface of the semiconductor body, the Hall sensor including a main extension surface along an elongation direction and side surfaces disposed perpendicular to the main extension surface, a width of the side surfaces being shorter than a width of the main extension surface;
    a magnet having a first magnetic pole with a first polarity and a second magnetic pole with a second polarity, the magnet including a first magnetic surface of only the first polarity, a second magnetic surface of only the second polarity, and a central axis perpendicular to the first magnetic surface and the second magnetic surface,
    wherein the metal carrier, the magnet and the semiconductor body are arranged in a common housing and at least one Hall sensor is arranged in the common housing,
    wherein the first magnetic surface of the magnet is arranged perpendicular to the main extension surface of the Hall sensor,
    wherein the central axis of the magnet runs parallel to the elongation direction of the Hall sensor,
    wherein the central axis of the magnet is perpendicular to a normal direction of the main extension surface, the normal direction of the main extension surface being perpendicular to the elongation direction of the Hall sensor,
    wherein field lines of the magnet run essentially parallel to the main extension surface of the Hall sensor so that a Hall voltage is generated when a part of the magnetic field lines are deflected by a ferromagnetic component, wherein an elongated side of the ferromagnetic component is parallel to the main extension surface of the Hall sensor, and
    wherein the first magnetic surface of the magnet is disposed on the second surface of the semiconductor body.

2. The integrated magnetic field sensor according to claim 1, wherein, with the deflection of the magnetic field lines, the Hall voltage is increased.

3. The integrated magnetic field sensor according to claim 1, wherein the at least one Hall sensor has a lateral surface arranged orthogonally to the main extension surface, and wherein the central axis of the magnet is perpendicular to a lateral surface.

4. The integrated magnetic field sensor according to claim 1, wherein the at least one Hall sensor is a 2-dimensional or 3-dimensional Hall sensor.

5. The integrated magnetic field sensor according to claim 4, wherein the main extension surface of the at least one Hall sensor is perpendicular to the first magnetic surface of the magnet such that a Hall voltage is generated even without the ferromagnetic component.

6. The integrated magnetic field sensor according to claim 1, wherein the at least one Hall sensor is a Hall plate.

7. The integrated magnetic field sensor according to claim 1, wherein the central axis of the magnet is coaxial with a central longitudinal axis of the Hall sensor.

8. The integrated magnetic field sensor according to claim 1, wherein the Hall sensor is embedded in the second surface of the semiconductor body.

9. A method for a determination of a position of a ferromagnetic component, the method comprising:
    providing an integrated magnetic field sensor, the integrated magnetic field sensor comprising: a semiconductor body with a first surface and a second surface, the first surface and the second surface being parallel; a metal carrier with a lower surface and an upper surface, wherein the first surface of the semiconductor body is disposed on the upper surface of the metal carrier; a Hall sensor arranged on the second surface of the semiconductor body, the Hall sensor including a main extension surface along an elongation direction and side surfaces disposed perpendicular to the main extension surface, a width of the side surfaces being shorter than a width of the main extension surface; and a magnet having a first magnetic pole with a first polarity and a second magnetic pole with a second polarity, the magnet including a first magnetic surface of only the first polarity, a second magnetic surface of only the second polarity, and a central axis perpendicular to the first magnetic surface and the second magnetic surface;
    arranging the metal carrier, the magnet and the semiconductor body in a common housing;
    arranging at least one Hall sensor in the common housing;
    arranging the first magnetic surface of the magnet perpendicular to the main extension surface of the Hall sensor and directly contacting one of the side surfaces of the Hall sensor, the central axis of the magnet running parallel to the main extension surface of the Hall sensor, the central axis of the magnet being perpendicular to a normal of the main extension surface, the normal direction of the main extension surface being perpendicular to the elongation direction of the Hall sensor, wherein magnetic field lines of the magnet run essentially parallel to the main extension surface of the Hall sensor so that a Hall voltage is generated when a part of the magnetic field lines are deflected by a ferromagnetic component, wherein an elongated side of the ferromagnetic component is parallel to the main extension surface of the Hall sensor; and
    arranging the first magnetic surface of the magnet on the second surface of the semiconductor body.

10. The method according to claim 9, wherein the Hall voltage is generated exclusively if the magnetic field lines are deflected.

11. The method according to claim 9, wherein the Hall voltage is increased exclusively if the magnetic field lines are deflected.

12. An integrated magnetic field sensor comprising:
a semiconductor body;
a Hall sensor, the Hall sensor being at least partially embedded in the semiconductor body, the Hall sensor including a main extension surface, a short side surface perpendicular to the main extension surface, a central longitudinal Hall axis that is parallel to the main extension surface and extends through a center of the Hall sensor, and a normal line perpendicular to the main extension surface and passing through a center of the main extension surface, a width of the side surfaces being shorter than a width of the main extension surface; and
a magnet having a first magnetic pole with a first polarity, a second magnetic pole with a second polarity, and a central axis extending through a center of the magnet from the first magnetic pole to the second magnetic pole, wherein the central axis of the magnet is coaxial with the central longitudinal Hall axis.

13. The integrated magnetic field sensor according to claim 12, further comprising: a metal carrier and a housing, wherein the semiconductor body is disposed on the metal carrier, wherein the metal carrier, the magnet and the semiconductor body are arranged in the housing.

14. The integrated magnetic field sensor according to claim 12, wherein a Hall voltage is generated only when a part of the magnetic field lines are deflected by a ferromagnetic component, and wherein an elongated side of the ferromagnetic component is perpendicular to the main extension surface of the Hall sensor.

15. The integrated magnetic field sensor according to claim 12, wherein the central axis is perpendicular to the normal line of the main extension surface, and wherein the normal line and the central axis of the magnet meet precisely at a centroid of the Hall sensor such that field lines of the magnet run essentially parallel to the main extension surface of the Hall sensor.

16. The integrated magnetic field sensor according to claim 12, wherein the Hall sensor is embedded such that an upper surface of the Hall sensor is flush with an upper surface of the semiconductor body.

* * * * *